US006247425B1

(12) United States Patent
Lymberopoulos et al.

(10) Patent No.: US 6,247,425 B1
(45) Date of Patent: Jun. 19, 2001

(54) METHOD AND APPARATUS FOR IMPROVING PROCESSING AND REDUCING CHARGE DAMAGE IN AN INDUCTIVELY COUPLED PLASMA REACTOR

(75) Inventors: Dimitris Lymberopoulos, Santa Clara; Peter Loewenhardt, San Jose; John Yamartino, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/579,177

(22) Filed: May 25, 2000

Related U.S. Application Data

(62) Division of application No. 09/049,722, filed on Mar. 27, 1998, now Pat. No. 6,085,688.
(51) Int. Cl.[7] .............................. C23C 16/00; H05H 1/00
(52) U.S. Cl. .......................................... 118/723 I; 156/345
(58) Field of Search .................... 156/345; 118/723 I, 118/723 IR, 723 MR, 723 MA, 723 AN

(56) References Cited

U.S. PATENT DOCUMENTS

| 4,123,316 | 10/1978 | Tsuchimoto . |
| 4,842,683 | 6/1989 | Cheng et al. . |

(List continued on next page.)

FOREIGN PATENT DOCUMENTS

| 0 489 407 | 10/1992 | (EP) . |
| 0 633 713 | 11/1995 | (EP) . |

OTHER PUBLICATIONS

Lee, Ho–Jun, Yang, Dong III, and Whand, Ki–Woong, "The effects of magnetic fields on a planar inductyively coupled argon plasma." *Plasma Sources Sci. Technol.*, vol. 5, United Kingdom, 1996, pp. 383–388.

Tynan, G.R., Bailey, A.D. III, Campbell, G.A., de Chambrier, A., Gibson, G., Hemker, D.J., Jones, K., Kuthi, A., Lee, and C., Wilcoxson, M., "Characterization of an Azimuthally Symmetric Helicon Wave High Density Plasma Source," *Trikon Technologies, Inc.*, Chatsworth, California, Jul. 1997.

*Primary Examiner*—Gregory Mills
*Assistant Examiner*—P. Hassanzadeh
(74) *Attorney, Agent, or Firm*—Michaelson and Wallace; Robert Wallace

(57) ABSTRACT

The present invention provides an apparatus and method for processing a workpiece in an inductively coupled plasma reactor. Inductive power is applied to the reactor to generate a plasma. A magnetic field is generated within the plasma reactor having lines of force oriented perpendicular to the workpiece surface. It is a feature of the invention to control the electron temperature near the surface of the workpiece by controlling the applied magnetic field. It is a further feature to increase average ion density near the workpiece without otherwise causing damage to the workpiece due to uneven charge build-up.

The applied magnetic field can be time invariant or time variant. In both cases processing can be optimized by adjusting the magnitude of the magnetic field to a level just below where damage due to uneven charge build-up occurs. With the time variant field, the average ion density can be adjusted with respect to average electron temperature. As such, average ion density near the workpiece can be increased without otherwise causing damage to the workpiece.

It is a further feature of the present invention to provide independently controllable conductors for generating the magnetic field and to provide an adjustable non-uniformly distributed magnetic field within the chamber. This can be used to selectively control plasma density or to selectively confine process gas species.

25 Claims, 8 Drawing Sheets

U.S. PATENT DOCUMENTS

| | | |
|---|---|---|
| 5,421,891 | 6/1995 | Campell et al. . |
| 5,468,341 | 11/1995 | Samukawa . |
| 5,556,501 * | 9/1996 | Collins et al. ............... 156/345 |
| 5,648,701 | 7/1997 | Hooke et al. . |
| 5,662,819 * | 9/1997 | Kadomura ...................... 438/711 |
| 5,669,975 | 9/1997 | Ashtiani . |
| 5,824,607 * | 10/1998 | Trow et al. ..................... 438/732 |
| 5,888,414 * | 3/1999 | Collins et al. ................... 216/68 |
| 6,068,784 * | 5/2000 | Collins et al. ................... 216/68 |
| 6,096,160 * | 8/2000 | Kadomura ...................... 156/345 |

* cited by examiner

METHOD AND APPARATUS FOR IMPROVING PROCESSING AND REDUCING CHARGE DAMAGE IN AN INDUCTIVELY COUPLED PLASMA REACTOR

This is a divisional of application Ser. No. 09/049,722 filed Mar. 27, 2998. U.S. Pat. No. 6,085,688.

BACKGROUND

The present invention relates to the field of plasma control for the processing of a workpiece, such as a semiconductor wafer, in an inductively coupled plasma reactor.

In a plasma reactor, a gaseous plasma comprising ions is formed within the reactor chamber for etching from or depositing on the workpiece. Among others, plasma parameters such as ion density within the plasma and ion flux to the workpiece control the processing rate. Adjusting the plasma parameters affects the rate and quality of processing.

A significant limiting factor in workpiece processing is uneven charge build-up on the workpiece surface. Uneven charge build-up can cause a voltage differential to build on the workpiece. If the magnitude of the differential exceeds a breakdown voltage on the workpiece, an electrostatic discharge occurs, damaging the workpiece. To prevent damage, etch rates or etch profiles must be limited.

Uneven charge build-up occurs when electrons strike the surface of the workpiece with high lateral velocity. When electrons have high lateral velocity, they are unable to adequately penetrate deep vertical holes and trenches. Ions, however, do not attain such high lateral velocity, so they can be drawn by the sheath to the bottom of the holes and trenches.

In a plasma reactor, the gaseous plasma is formed by separating electrons from atoms or molecules to create ions. Electrons and ions have equal and opposite charges. The mass of the ions, however, is much greater than the mass of the electron. So, as the electron is separated from the molecule, it flies away with a much higher thermal velocity than does the ion. The thermal velocity of the electron or $v_{the}$ is at least 100 times greater than the thermal velocity of an ion or $v_{thi}$. Electron and ion thermal velocities are given by the equations:

$$v_{the} = (eT_e/m_e)^{1/2}$$

and;

$$v_{thi} = (eT_i/m_i)^{1/2}$$

where e=the unsigned charge of an electron;
$T_e$=temperature of the electron in volts;
$T_i$=temperature of the ion in volts;
$m_e$=mass of the electron; and
$m_i$=mass of the ion.

The lower thermal velocity ions, having a lower lateral velocity component, can be attracted by the voltage sheath to the surface of the workpiece so that they impinge upon the surface in a generally normal or perpendicular fashion. The direction of the electrons, however, are less affected by the sheath due to their high lateral component. High velocity electrons impinge the surface of the workpiece at acute angles far less than perpendicular. This leads to uneven charge build-up.

For example, uneven charge build-up results when a deep vertical hole is etched in the workpiece surface. Ions etching the bottom surface of the hole impart a positive charge, while high temperature less directionally controlled electrons are unable to penetrate the hole. The high temperature electrons, unable to penetrate to the bottom surface of the hole, strike adjacent surfaces on the wafer and cause negative charge build-up on those surfaces. When the potential between the surfaces reaches the break down voltage of the workpiece, an electrostatic discharge occurs damaging the workpiece. Reduction of component sizes has led to the need for more extreme workpiece surface profiles. As the depth increases and breadth decreases, damage due to uneven charge build-up is even more likely to occur and more difficult to control.

One way of reducing electron velocity would be to reduce source power. Unfortunately, this would also reduce plasma density. The ability to lower electron thermal velocity to reduce uneven charge build-up without sacrificing plasma density or ion flux would not only improve processing quality, it would also improve workpiece processing time. As plasma reactors typically process thousands of workpieces, a reduction in processing time translates into a significant reduction in reactor operating time. This would not only allow demand to be met more effectively, it would reduce materials expenses and reactor maintenance costs per workpiece. Plasma and process gases are typically housed within the chamber. Exposure to the plasma and other chamber gases can cause degradation of the chamber surfaces. As a result, reactors periodically must go down for cleaning or for part replacement. Limiting exposure of reactor components to plasma and other process gases reduces maintenance costs.

It is an object of the current invention to reduce workpiece processing time. It is another object of the invention to reduce electron temperature within a plasma without substantially affecting ion density or ion flux. It is a further object of the invention to provide an inductively coupled plasma reactor that reduces workpiece damage due to uneven charge build-up. It is yet another object of the invention to reduce degradation of reactor components.

SUMMARY OF THE INVENTION

The present invention provides an apparatus and method for processing a workpiece in an inductive plasma reactor. Inductive power is applied to the reactor to generate a plasma. A magnetic field is generated within the plasma reactor having lines of force oriented perpendicular to the workpiece surface. It is a feature of the invention to control the electron temperature near the surface of the workpiece by controlling the applied magnetic field. It is a further feature to increase average ion density near the workpiece without otherwise causing damage to the workpiece due to uneven charge build-up.

The applied magnetic field can be time invariant or time variant. In both cases, processing can be optimized by adjusting the magnitude of the magnetic field to a level just below where damage due to uneven charge build-up occurs. With the time variant field, the average ion density can be adjusted with respect to average electron temperature. As such, average ion density near the workpiece can by increased without otherwise causing damage to the workpiece.

It is a further feature of the present invention to provide independently controllable conductors for generating the magnetic field and to provide an adjustable non-uniformly distributed magnetic field within the chamber. This can be used to selectively control plasma density or to selectively confine process gas species.

BRIEF DESCRIPTION OF THE DRAWINGS

Prior Art

Prior Art

DETAILED DESCRIPTION

Figure 1:
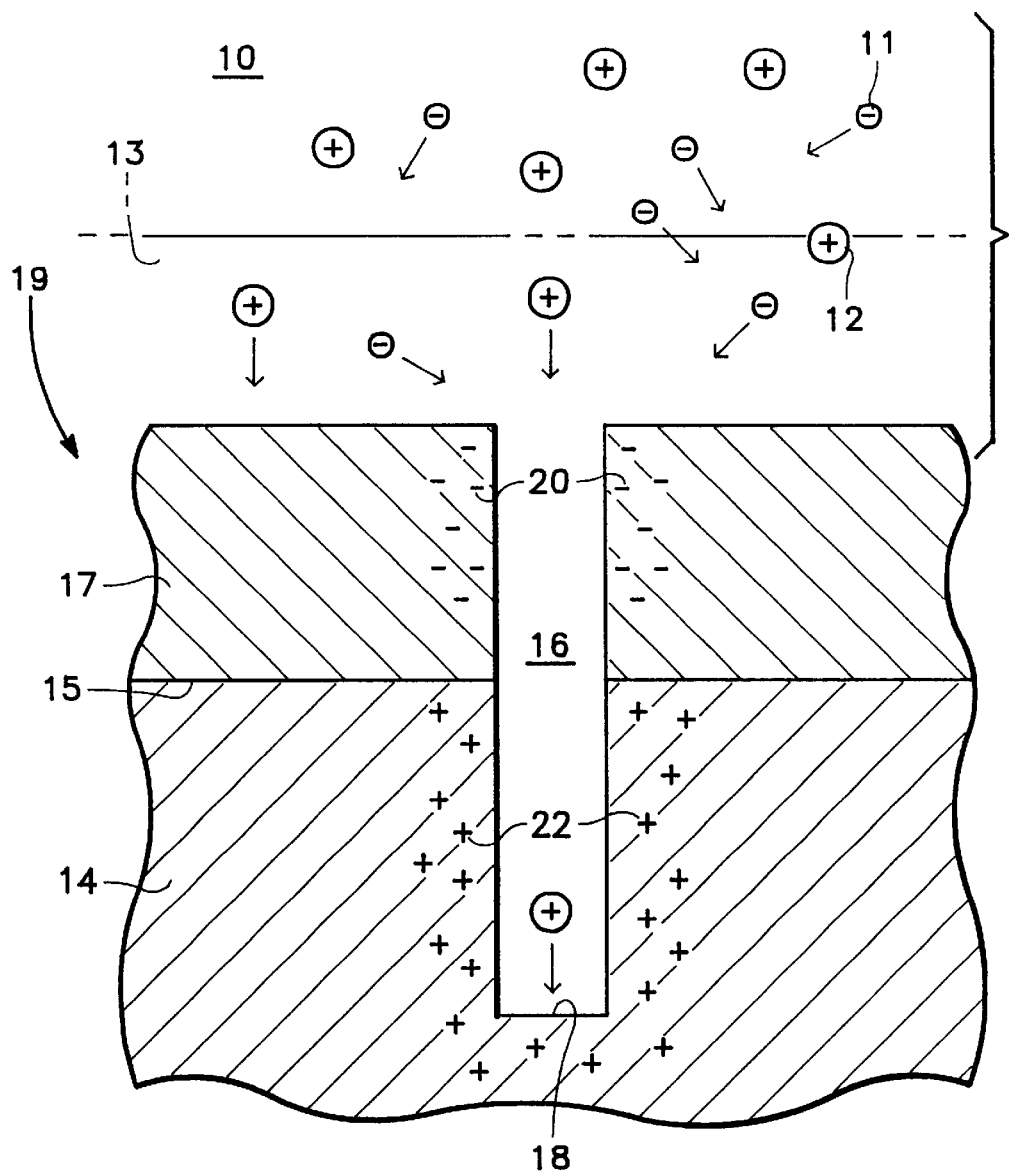
FIG. 1 illustrates how charge build-up occurs on a workpiece during plasma etching.

Uneven Charge Build-up (FIG. 1)

FIG. 1 illustrates how charge build-up occurs on a workpiece 14 during plasma etching. A plasma 10 is comprised of positively charged ions 12 and electrons 11. An RF bias is applied to the workpiece substrate 14 to attract the charged particles 11, 12 toward the workpiece substrate surface 15. An alternating voltage sheath 13 forms between the plasma and workpiece 19 which draws the ions 12 or the electrons 11 to the surface 15 of the workpiece.

As electrons 11 are separated from the process gas molecules to form the plasma 10, electrons 11 fly away leaving ions 12 behind. Because ions 12 have a much greater mass than do the electrons 11, the electrons 11 attain a high thermal velocity as compared to the ions 12. This high velocity naturally includes a large component parallel or horizontal to the substrate surface 15. The ions, on the other hand, have a low horizontal velocity vector.

Since the ions have a low thermal velocity, the sheath 13 draws the ions generally perpendicular to the surface 15 of the workpiece 19. Ions, therefore, can be drawn by the sheath to the bottom surface 18 of the trench 16 for etching the substrate 14. Because the electrons have such a high horizontal velocity component, their resultant vector toward the workpiece surface is far less than perpendicular. The electrons, therefore, are unable to penetrate all the way to the bottom of the trench 16. Instead, the electrons impinge photoresist or oxide layer 17 near the top of the trench 16 causing a negative charge 20 to build. The ions 12 drawn to the bottom of the trench impart a positive charge 22 causing positive charge to build, thereby creating a charge gradient. When the gradient caused by the uneven charge build-up exceeds the breakdown voltage, an electrostatic discharge will occur damaging the workpiece.

Figure 2:
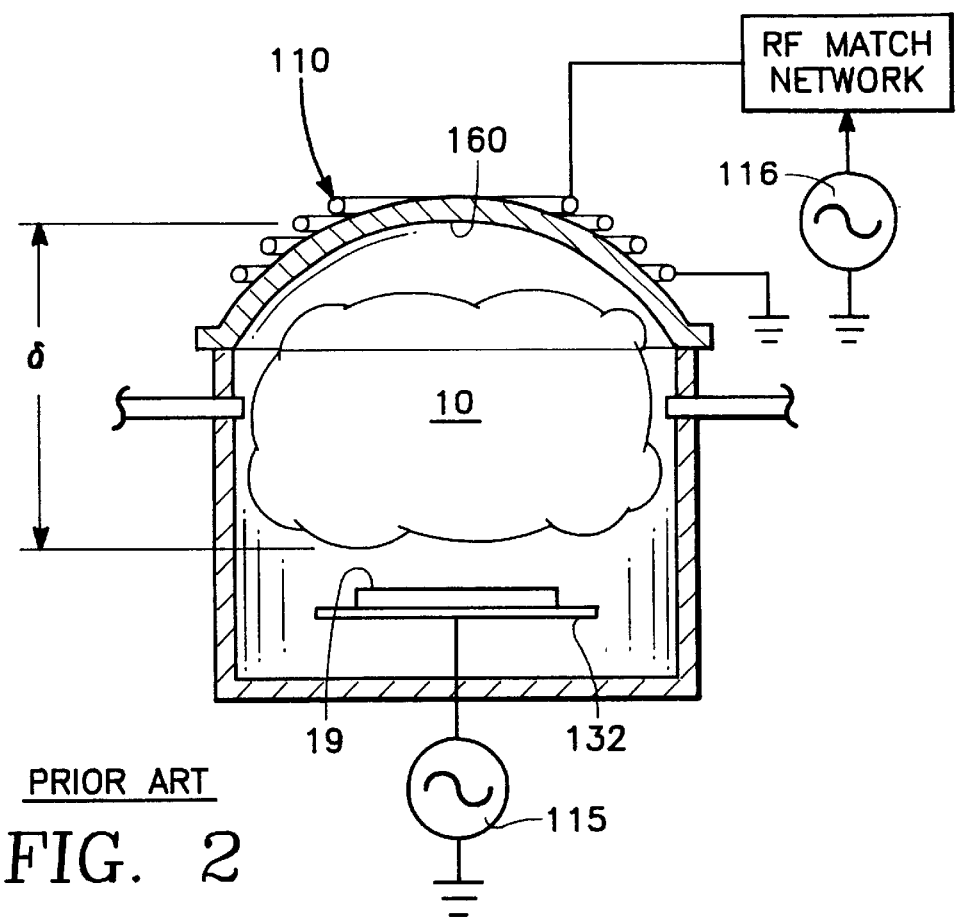
FIG. 2 depicts a prior art inductive plasma reactor.
Figure 3:
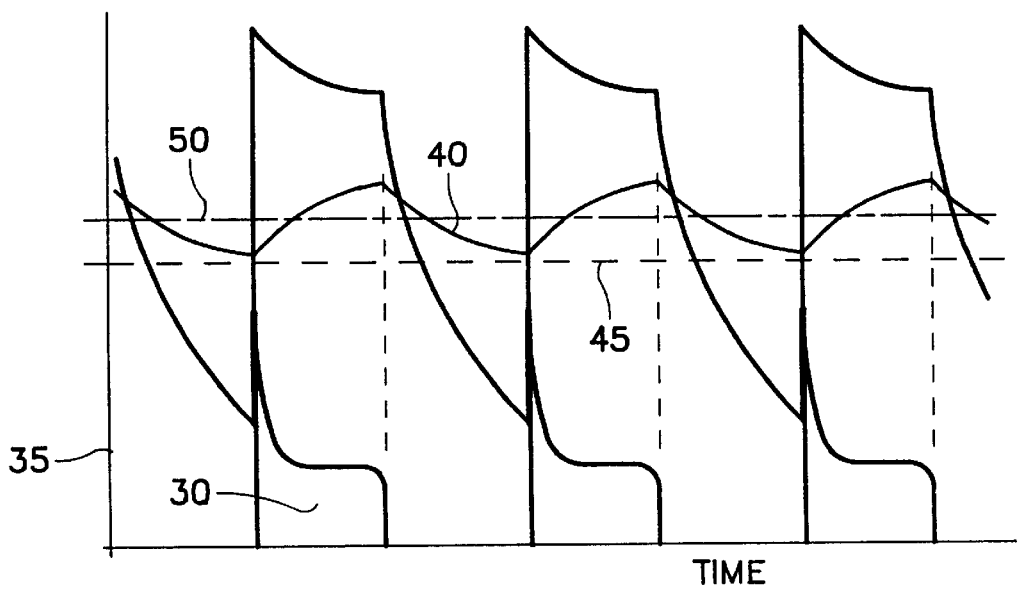
FIG. 3 shows the effects of pulsed source power on electron temperature and electron density.
Figure 4:
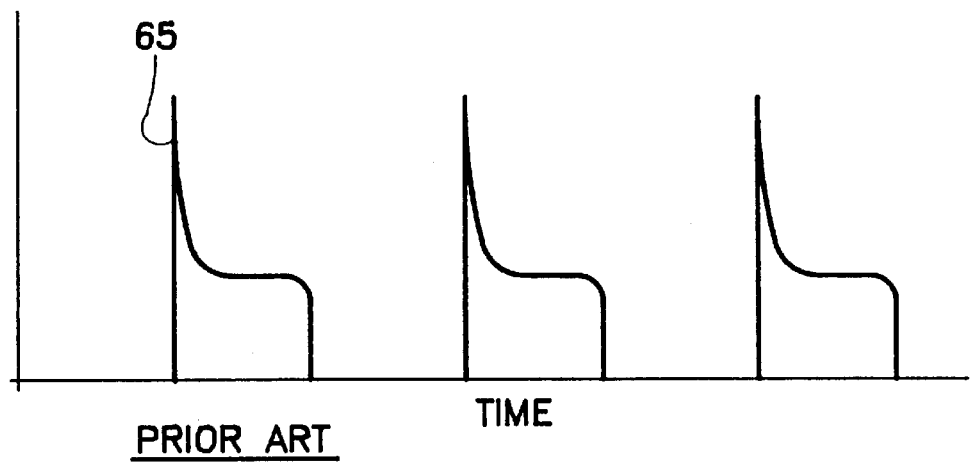
FIG. 4 shows the problem of transients in source power pulses.

Preventing Uneven Charge Build-up (FIGS. 2-4)

One way to control electron temperature near the workpiece 19 is to adjust the physical proximity of plasma 10 generation to the workpiece 19. By generating the plasma 10 distant from the workpiece 19, as shown in Prior Art FIG. 2, the electron temperature at the workpiece 19 is reduced through collisional dissipation prior to reaching the workpiece 19. The use of inductive power coils 110 rather than capacitive power for plasma generation allows a dense plasma to be generated distant from the workpiece thereby reducing electron temperature near the surface of the workpiece 19. A capacitive bias 115 can be applied to control particle energy or flux to the workpiece.

In generating the plasma, inductive power is transferred to the plasma electrons within a skin depth $\delta$. Power is transferred to the electrons directly from the electric field and by collisional or ohmic dissipation. When the electron-to-neutral momentum transfer frequency is much greater than the inductive power frequency, the collisional skin depth or $\delta_c$ is given by the following equation:

$$\delta_c = (2/(\omega \mu_0 \sigma))^{1/2}$$

where $\omega$ = the inductive power frequency;

$\mu_0$ = the permeability of free space; and $\sigma$ = the conductivity of the plasma.

Thus, the electron temperature can be lowered near the wafer surface by adjusting the inductive power frequency or by adjusting the plasma conductivity by controlling the chamber pressure. Process constraints, however, may limit the adjustability of these parameters.

Furthermore, other constraints may limit the adjustability of these parameters. For example, plasma reactors have been allocated the 13.5 MHz and the 2 MHz frequency ranges by the Federal Communications Commission (FCC). FCC regulations do not permit external transmission of inductive power outside of the 13.5 MHZ and the 2 MHZ frequency ranges. Therefore, elaborate electromagnetic shielding must be provided in order to adjust the inductive power outside of these frequency ranges. This adds to the cost and size of the reactor.

Electron temperature near the workpiece also can be adjusted by changing the proximity of the inductive coil 110 with respect to the workpiece 19. For example, the height of the chamber ceiling 160 or the position of the workpiece pedestal 132 could be moved. These options, however, are undesirable, or at best limited, due to the size and complexities of the chamber.

Although moving plasma generation away from the surface of the workpiece helps control charge build-up, it has the disadvantage of reducing ion density near the wafer. It is desirable to have high ion density near the workpiece. Reducing ion density increases process times and could cause etch stopping. A denser plasma provides more ions and electrons close to the surface of the workpiece for processing. Plasma density near the surface of the workpiece, though, is limited by the problem of high temperature electrons leading to uneven charge build-up.

Another possible solution to reducing damage from uneven charge build-up is to pulse inductive power. Pulsed RF source power has been employed in Electron Cyclotron Resonance devices to lower electron thermal velocity. Prior Art FIG. 3 shows the effects of pulsed source power 30 on electron temperature 35 and electron density 40. As electron thermal velocity is proportional to electron temperature, electron thermal velocity can be lowered by reducing electron temperature 35 within the plasma. Electron temperature 35 responds rapidly to applied source power 30, while electron density 40 responds more slowly. Therefore, average electron temperature 45 can be lowered while maintaining a high average ion or electron density 50. Such devices are not without shortcomings.

Turning to Prior Art FIG. 4, a problem with pulsing source power is control of source power transfer to the plasma. FIG. 4 illustrates the problem of transients 65. As source power is applied, the plasma's impedance changes causing impedance mis-match and difficulty controlling source power coupling to the plasma. This causes the inductive power transient spike 65 which could cause damage to the workpiece. To reduce the source power transients 65, the source power coupling to the plasma requires dynamic impedance matching of the source power and the plasma. Such a network is expensive and not entirely effective.

The Presently Preferred Embodiment of the Present Invention (FIGS. 5–13)

Figure 5:
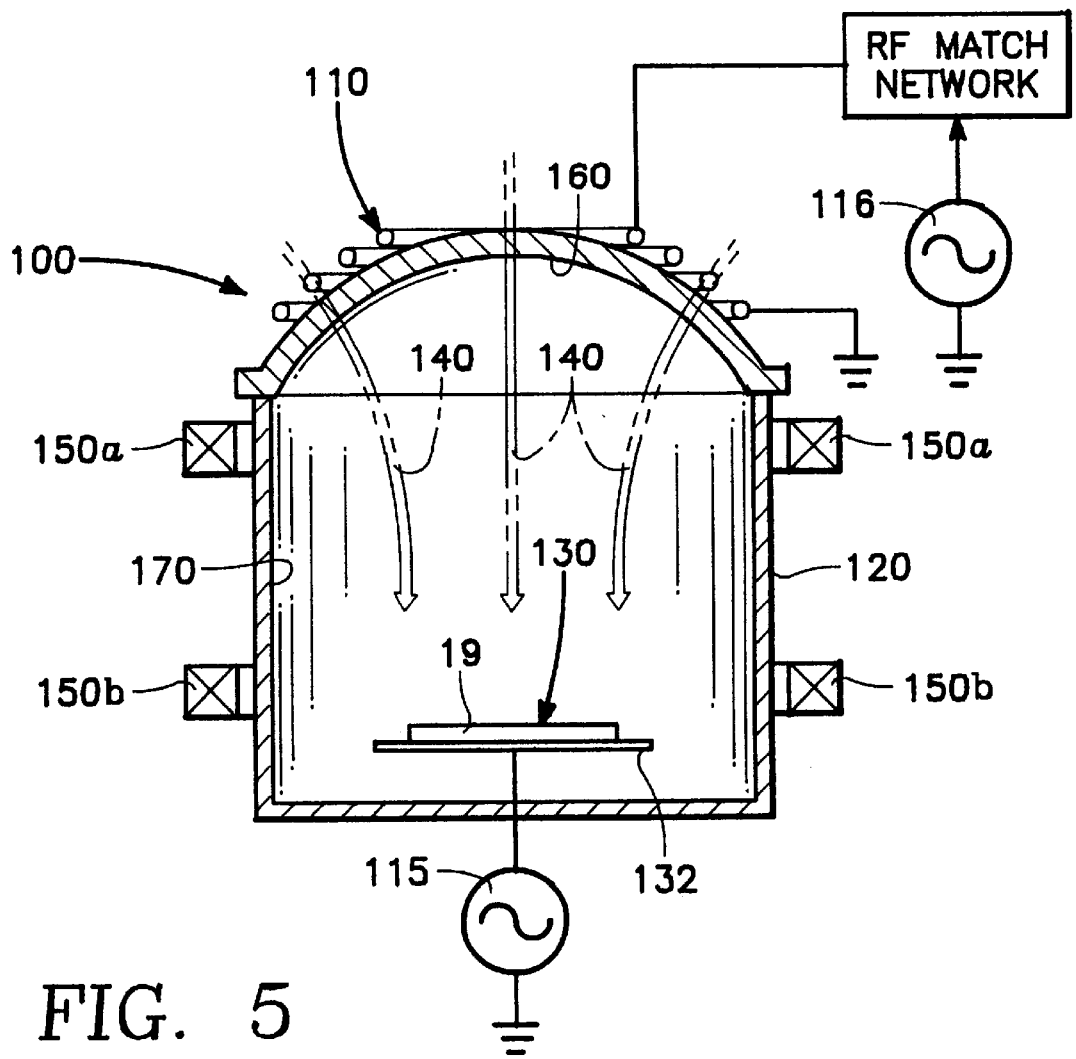
FIG. 5 illustrates an inductive plasma reactor of the present invention having magnetic lines of force oriented perpendicular to the surface of the workpiece.

FIG. 5 illustrates an inductively coupled plasma reactor 100 having inductive coils 110 for creating a plasma in the reactor chamber 120. A bias 115 is applied to pedestal 132 to control the flux of plasma particles to a workpiece 19, such as a semiconductor wafer. The plasma particles act upon the workpiece 19. The reactor thus far described may be of the metal decoupled plasma source(DPS) reactor type, produced by Applied Materials Incorporated of Santa Clara, Calif. The present invention, however, is not limited to this type of reactor. U.S. patent application Ser. No. 08/936,028 for PARALLEL-PLATE ELECTRODE PLASMA REACTOR HAVING AN INDUCTIVE ANTENNA COUPLING POWER THROUGH A PARALLEL PLATE ELECTRODE, filed Sep. 23, 1997 (pending), incorporated by reference, provides a description of a decoupled plasma source reactor.

To reduce charge build-up on the surface of the wafer, the presently preferred embodiment of FIG. 5, provides a magnetic field 140, oriented generally perpendicular to the wafer 130 surface. A magnetic field generator, in the form of conductors 150a & 150b supplied with current, create the magnetic field 140. It is presently preferred to locate the conductors 150a & 150b concentrically around the chamber 120 so as to provide the magnetic field 140 generally perpendicular to the wafer surface 130. The magnetic field 140 provides a means to lower electron temperature at the wafer surface without adjusting pressure, frequency, or inductive coil proximity.

Figure 6:
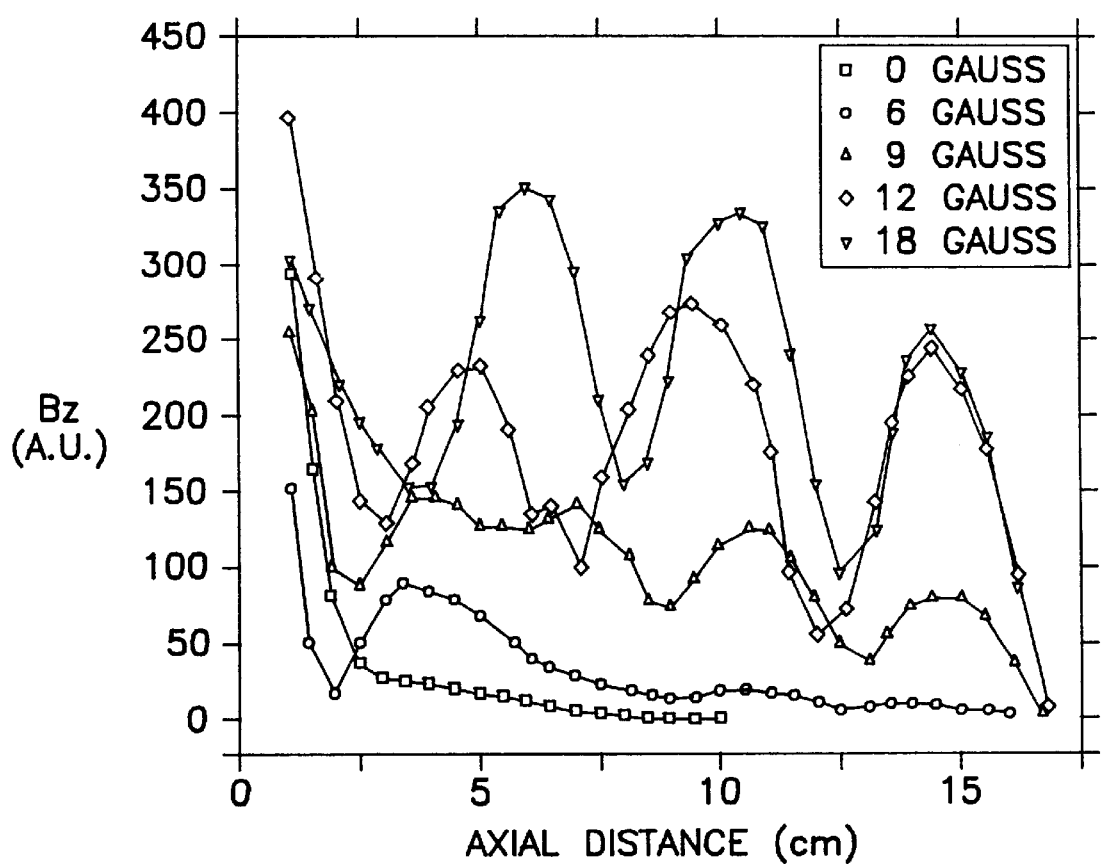
FIG. 6 shows the spatial distribution of the time varying magnetic induction field $B_z$ along the axial direction, measured at the center of the chamber, for different applied time invariant magnetic fields oriented perpendicular to the wafer.
Figure 7:
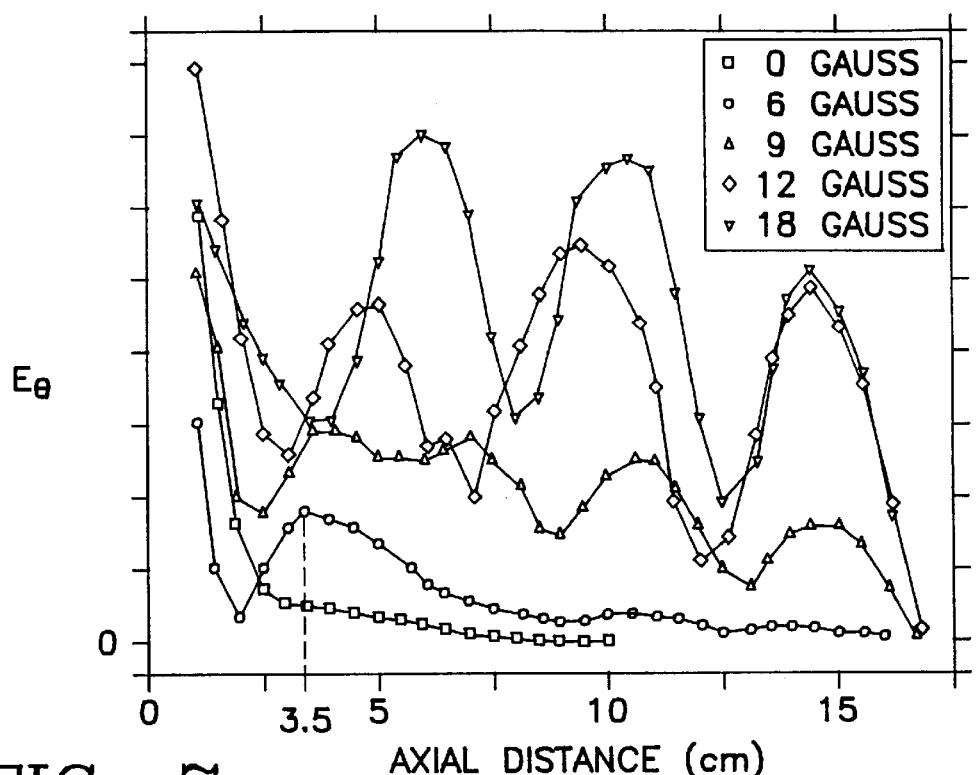
FIG. 7 illustrates the anticipated distribution of the inductive electric field $E_{74}$.

FIG. 6 shows the spatial distribution of the time varying magnetic induction field $B_z$ along the axial direction, measured at the center of the chamber, for different applied time invariant magnetic fields oriented perpendicular to the wafer. The input source power is 500 watts and the operating pressure is 5 mTorr. FIG. 7 illustrates the anticipated distribution of the inductive electric field $E_\theta$ under the same conditions as FIG. 6. As the magnetic field is applied, the power distribution within the chamber is modified. By modifying the power distribution within the chamber, the skin depth can be adjusted. Therefore, the electron temperature can be adjusted near the workpiece without adjusting pressure, frequency, or inductive coil proximity.

In addition to providing a means for adjusting electron temperature, the magnetic field provides a means for lowering the inductive power while maintaining sufficient plasma density to prevent etch stopping. Because plasma can be generated closer to the wafer surface without increasing inductive power, inductive power can be lowered. An advantage of lowering inductive power is that power loss through the reactor ceiling or window can be reduced. For example, referring to FIG. 7, applying a 6 gauss magnetic field reduces the anticipated electric field $E_\theta$ near the ceiling and increases $E_\theta$ near the workpiece as compared to when no magnetic field is applied. Hence, inductive power can be lowered. This reduces power loss through the window.

Yet another advantage of adjusting the power coupling to the plasma is that the plasma density near the ceiling can be reduced. This reduces plasma damage to the window.

Figure 8:
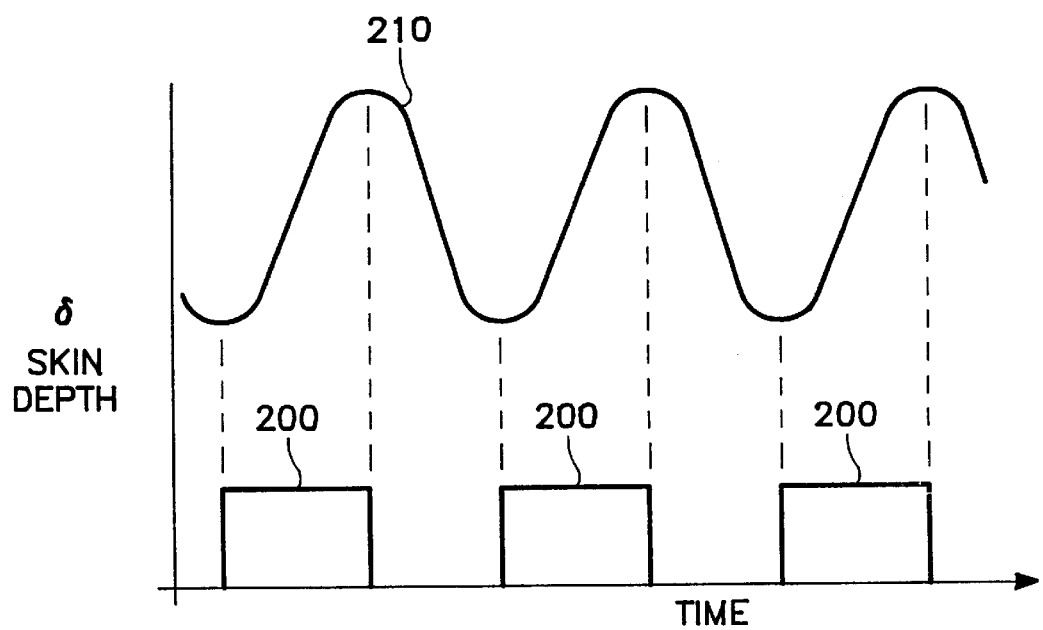
FIG. 8 illustrates the anticipated effect of a pulsed magnetic field, on skin depth near the surface of the wafer.

It is a further feature of the invention to provide a means to time vary the applied magnetic field, such as by pulsing zero to five gauss. Referring to FIG. 5, current can be pulsed through the conductors 150a & 150b to provide the pulsed magnetic field. Time varying the magnetic field, such as by pulsing, allows the electron temperature near the surface of the wafer to be reduced while not significantly affecting ion density. FIG. 8 illustrates the anticipated effect of a pulsed magnetic field 200, oriented generally perpendicular to the wafer surface, on skin depth 210 near the surface of the wafer. The magnetic field pulses 200 cause the skin depth 210 to vary.

As discussed above, skin depth is the distance from the inductive coil that electric field power is coupled to the plasma. As skin-depth increases, more power is delivered to electrons further from the inductive coil. Consequently, an increase in skin depth causes the temperature of electrons and electron density near the surface of the wafer to increase. Therefore, controlling the magnetic field flux, provides a means to control electron temperature and density near the surface of the wafer.

Figure 9:
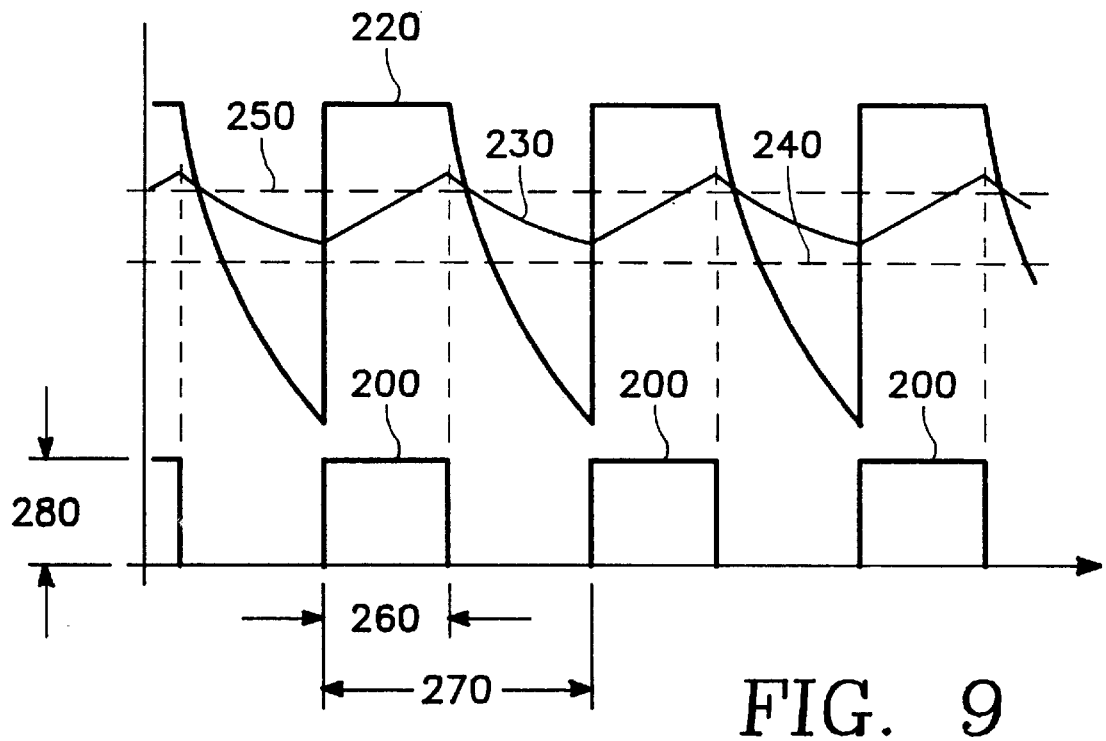
FIG. 9 illustrates an example of the anticipated response of electron temperature and electron density to magnetic field pulses.

Turning to FIG. 9, as the power delivered to the plasma near the surface of the wafer changes, electron temperature 220 and densities 230 also change. Electron temperature 220 responds more rapidly to applied inductive power than does electron density 230. Therefore, the time varying magnetic field 200 can be used to independently adjust the average electron temperature 240 and density 250 near the wafer surface.

FIG. 9 illustrates an example of the response of electron temperature 220 and electron density 230 to magnetic field pulses 200. Average electron temperature 240 can be lowered while not significantly reducing average electron density 250. Varying the magnitude, duration, and duty cycle of the pulses 200 provides a means for independent adjustment of average electron temperature 240 and density 250 near the surface of the wafer. This allows electron temperature to be lowered without significantly reducing ion density and flux. Time varying the magnetic field within the chamber, therefore, provides a means for adjusting average electron temperature near the workpiece with respect to average ion density near the workpiece.

Reducing electron temperature lowers electron thermal velocity and allows the electrons to be drawn more perpendicularly toward the surface of the workpiece by the sheath. This allows the electrons to be drawn into deep holes or trenches thereby reducing uneven charge build-up. Consequently, application of a time varying magnetic field perpendicular to the wafer surface provides a means for reducing uneven charge build-up on the workpiece surface without adversely affecting process time.

Figure 10:
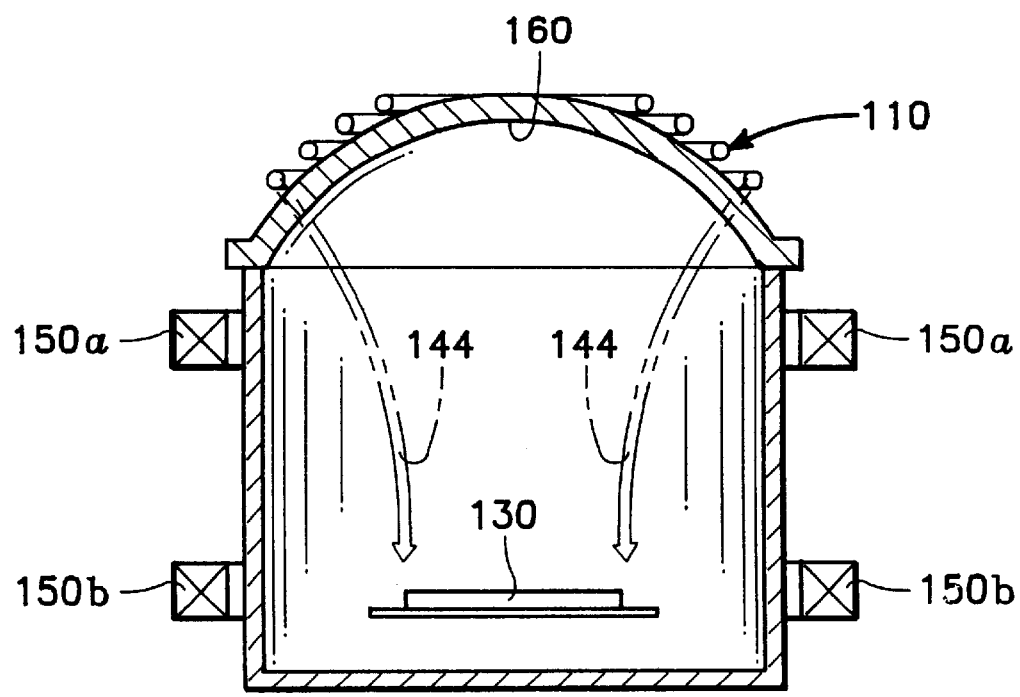
FIG. 10 shows that the distribution of the magnetic field can be adjusted to provide an increased field strength near the wafer surface.
Figure 11:
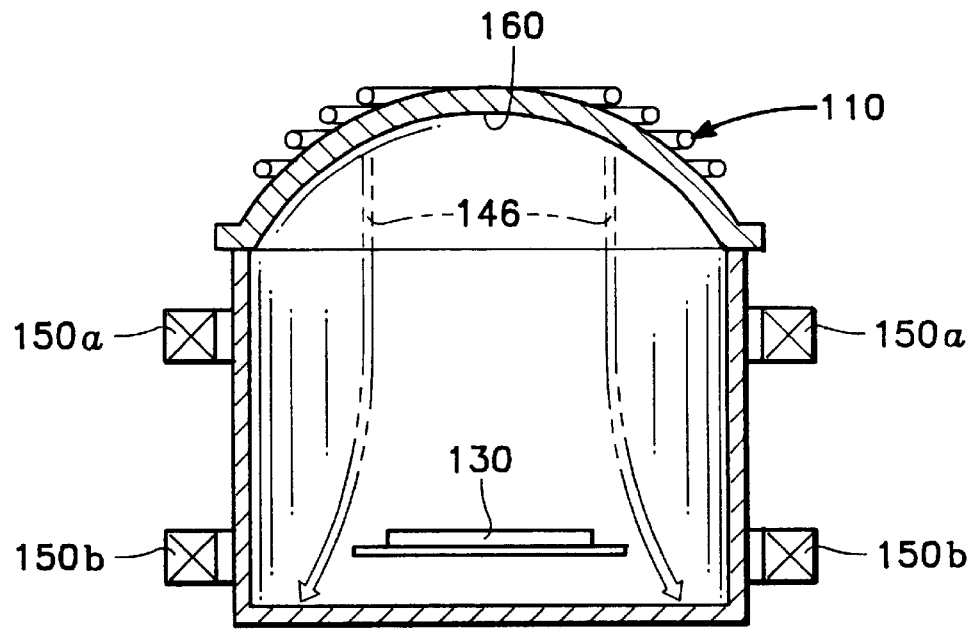
FIG. 11 shows that distribution of the magnetic field can be adjusted to provide a decreased field strength near the wafer surface.

Turning to FIGS. 10 & 11, it is also a feature of the present invention to provide independent control of the current through conductors 150a & 150b. Independent control of the current allows the distribution of the magnetic field 140 within the reactor 100 to be controlled so as to create a non-uniform magnetic field within the chamber. FIGS. 10 & 11 show how the distribution of the magnetic field 140 can be adjusted to provide an increased magnetic field 144 or decreased magnetic field 146 field strength near the wafer surface 130. The conductors 150a & 150b, therefore, can be used to focus or defocus the magnetic field 140. In addition, the magnetic field strength can be controlled such that it varies with time between magnetic field 144 and magnetic field 146. Although FIGS. 5, 10 & 11 are shown for illustration purposes with two sets of conductors, any number of conductors could be used.

The magnetic field generator, therefore, is capable of providing simultaneous and independent adjustment of the density of the plasma near the workpiece and the density of the plasma remote from the workpiece. Independent control of the conductors provides a means for controlling the density of the plasma near the surface of the workpiece and the density of the plasma remote from the surface of the workpiece without adjusting the RF electric field.

It is also a feature of the present invention to provide a means to reduce damage to reactor components due to plasma exposure. By applying sufficient magnetic field to confine the plasma away from part or all of the reactor walls, damage to those surfaces can be reduced. Furthermore, confining the plasma away from, or controlling the plasma density near part or all of the reactor components for at least part of the time, such as by applying a pulsed magnetic field sufficient to contain the plasma for part of the time, reduces damage to reactor components. In addition, the magnetic field generator could be used to selectively confine species as desired.

Figure 12:
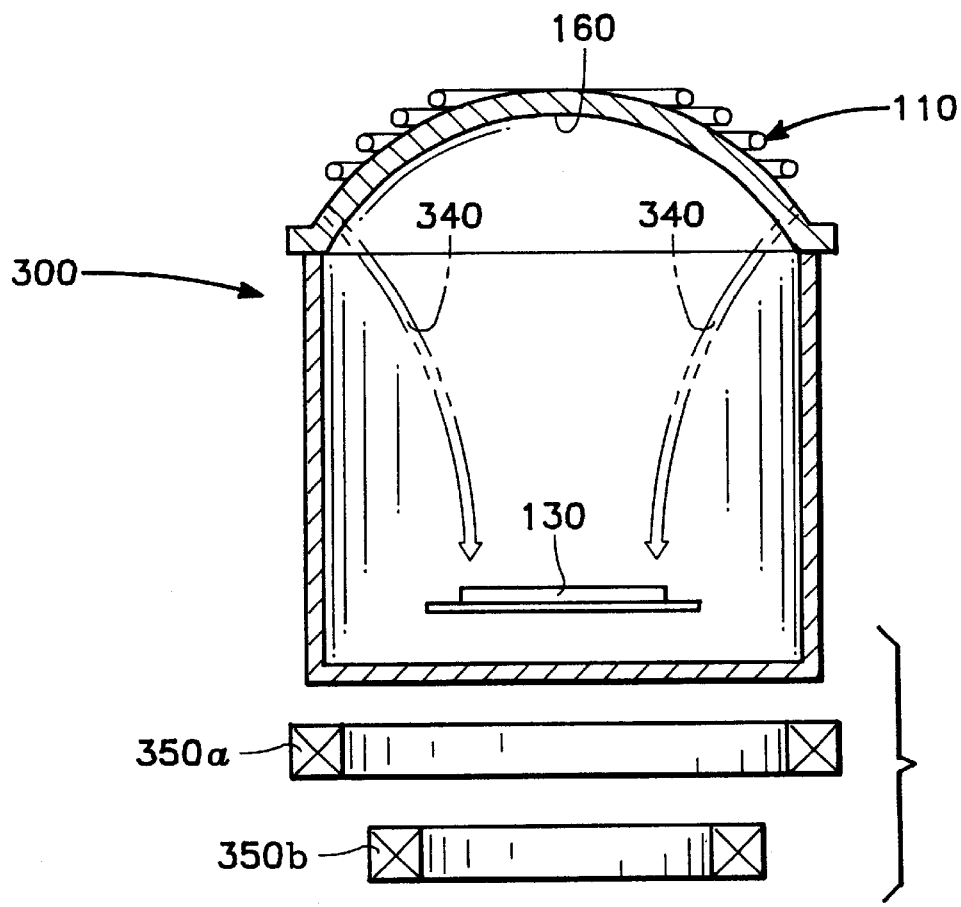
FIG. 12 illustrates possible alternate conductor layout to produce the non-uniform magnetic field.

FIG. 12 shows possible alternate conductor 350a & 350b layout to produce the non-uniform magnetic field 340 within the chamber 300. FIG. 12 illustrates the conductors 350a and 350b located below the chamber. It also shows conductor 350a having a larger radius than conductor 350b. The conductors 350a and 350b could also have much larger or much smaller radii than illustrated in FIG. 12.

Figure 13:
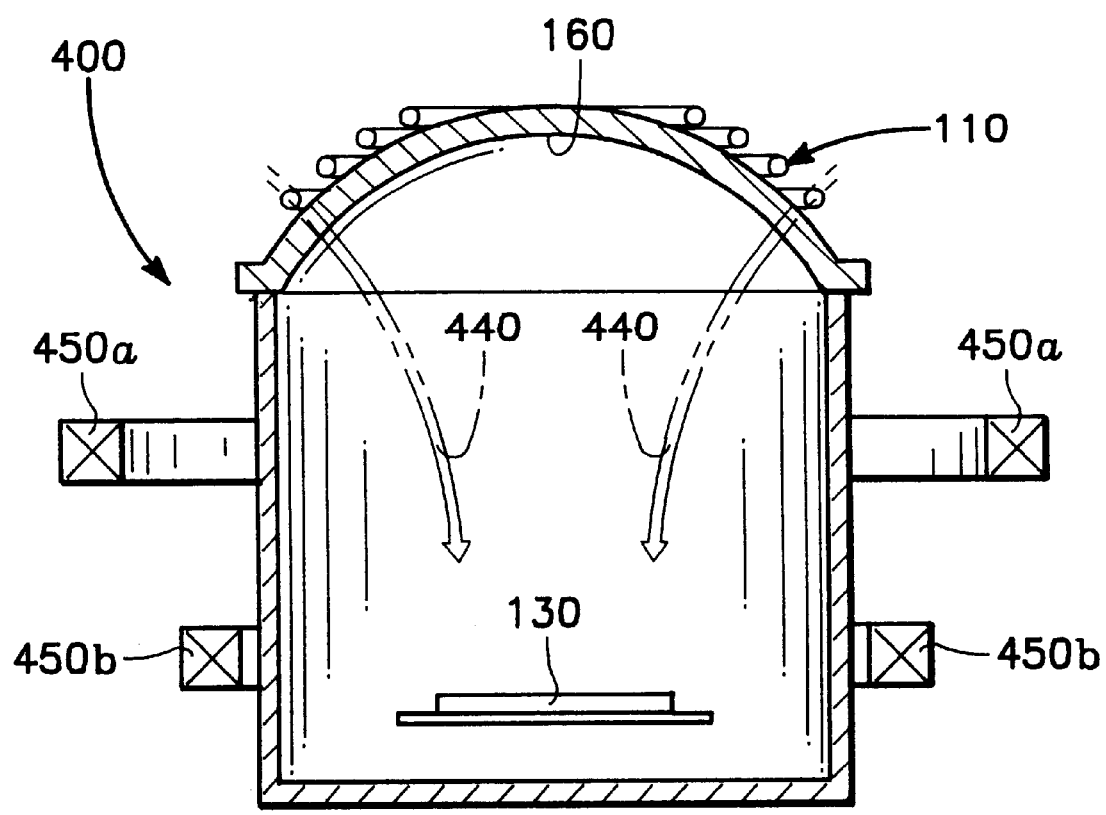
FIG. 13 illustrates possible alternate conductor layout to produce the non-uniform magnetic field.

FIG. 13 shows yet another possible alternate conductor layout to produce the non-uniform magnetic field 440 within chamber 400 according to the present invention. Conductor 450a is shown having a larger radius than conductor 450b. It is also possible in this embodiment to place conductor 450b totally or partially within conductor 450a in a nested or overlapping fashion. In addition, it is possible to have the conductors 450b and 450a separately controlled. While only two conductors are shown for illustrations purposes, any number of conductors could be used to provide the magnetic field. Although not shown, some of the conductors could also be located above the top wall or ceiling of the chamber.

Method and Principle of Operation of the Present Invention

The present invention provides a method to control plasma parameters in an inductively coupled plasma reactor without changing the reactor chamber configuration or pressure, RF source power magnitude or frequency, process gas density or temperature, or workpiece bias. The method of the present invention utilizes the magnetic field to reduce workpiece damage due to uneven charge build-up and to reduce damage to reactor components.

Referring to FIG. 5, current is supplied to the magnetic field generator or conductors 150a & 150b to provide a magnetic field 140 having its lines of force oriented generally perpendicular to the wafer surface. The magnetic field flux is controlled by varying the current through conductors 150a & 150b.

It is a feature of the present invention to provide a method to reduce charge damage or damage to workpieces due to uneven build-up of charge by adjusting the average magnitude of the applied magnetic field to a level just below where damage due to uneven charge build-up occurs. This can be accomplished utilizing a time invariant or a time variant magnetic field. A means is provided to adjust the applied magnetic field inside the chamber. For the time invariant case, charge damage for a particular operating regime is controlled by adjusting the level of DC current through the conductors 150a & 150b so as to adjust the static magnetic field 140 within the chamber 100. As the magnitude of the magnetic field within the chamber is increased, the magnitude of the inductive electric field $E_\theta$, illustrated in FIG. 7, increases closer to the surface of the workpiece. As the electric field $E_\theta$ and resultant skin depth increases, the temperature of the electrons near the workpiece generally increases. As electron temperature increases the problem of uneven charge build-up builds. To prevent damage to the workpiece, the average magnitude of the magnetic field is adjusted to optimize process time or quality without incurring workpiece damage. This can be done, for example, by adjusting the DC current through conductors 150a & 150b. In this way, for a particular regime, process time can be finely tuned to a point short of producing charge damage. Therefore, to reduce charge damage due to uneven charge build-up for a given set of plasma parameters, the current through the conductors 150a & 150b is adjusted below the point where charge damage occurs. In addition, inductive power could be adjusted along with the average magnitude of the magnetic field to balance charge damage and process effectiveness.

It is a further feature of the present invention to reduce charge damage by-time varying the magnetic field 140. One method is to pulse sufficient current through the conductors 150a & 150b to create a pulsed magnetic field within the chamber 120. A pulse magnitude is selected, such as zero to five gauss. The pulse width 260 and duty cycle 270 of the magnetic field 200, as shown in FIG. 9, is adjusted so that the average electron temperature 240 is reduced while maintaining sufficient average electron density 250 to continue the workpiece processing. By adjusting the inductive power and the applied magnetic field, such as pulse magnitude 280, duration 260, or duty cycle 270, electron temperature near the workpiece can be lowered while maintaining ion density near the workpiece. For, example, a pulsed magnetic field could be selected and the inductive power adjusted so as to maintain ion and electron densities at pre-applied magnetic field values. As a result of lower average electron temperature, average ion density can be raised to a level that would otherwise cause charge damage.

As such, a means for controlling uneven charge build-up on the workpiece is provided.

As workpiece processing parameters such as: inductive power frequency; inductive coil distance to the workpiece;

inductive power coupling to the chamber; and process gas composition, temperature, and pressure can affect skin depth and ion density near the workpiece surface, there are several combinations of pulse magnitude, duration, and duty cycle values that could be used to achieve the desired results. The following principles of operation can be used by one reasonably skilled in the art to empirically determine the proper range of values suited for a particular application.

Electron temperature responds more rapidly to changes in inductive electric field power Ea than does electron density. Modifying the skin depth of the inductive electric field $E_\theta$ by applying a time varied magnetic field causes the average electron temperature 240 to lower, as illustrated in FIG. 9, while not substantially lowering electron density 230. Referring to FIG. 7, pulsing the applied magnetic field from zero to six gauss for example, causes the value of the inductive electric field $E_\theta$ to switch between the zero and six gauss curves illustrated. In this way, the skin depth can be made to oscillated as illustrated in FIG. 8, thereby producing a reduction in average electron temperature while not significantly reducing electron density as illustrated in FIG. 9.

For example, the electric field $E_\theta$ at an axial distance of approximately 3.5 cm, correspondingly will increase and decrease as the applied magnetic field is switched from zero to six to zero gauss. As from the perspective of a point within the chamber at an axial distance away from the ceiling, the electric field $E_\theta$ appears to pulse as if source power were being pulsed. By pulsing the applied magnetic field, therefore, advantage may be taken of the disparate response of electron temperature and density to changes in inductive field power to adjust average electron temperature near the workpiece surface.

Therefore, to reduce charge damage due to uneven charge build-up for a given set of plasma parameters, the average magnitude of the-current through the conductors is adjusted to a point below where charge damage occurs. This can be achieved by adjusting the magnitude, pulse duration, or duty cycle of the applied magnetic field.

It should be noted that, unlike pulsing the source power, pulsing current through the magnetic field generator does not create as severe an impedance mismatch difficulty.

The magnitude, pulse duration, and duty cycle of the magnetic field are adjustable parameters used to optimize processing, to reduce average electron temperature near the workpiece, and to reduce charge damage to the workpiece. The parameters are characterized as having a threshold above which charge damage occurs on the workpiece. The parameters are adjusted below this threshold. The threshold for a particular process readily can be determined by empirical means. For example, for given process parameters such as inductive power, capacitive power, process gas density, polymer gas density, photoresist thickness, and desired etch profile, the threshold can be determined by processing several sample workpieces while adjusting the magnetic field parameters for each sample until the charge damage threshold is observed. The magnetic field parameters then could be adjusted to within 20% of the threshold. Preferably, the magnetic field parameters would be adjusted to within at least 10% of the threshold, optimally to within 5% of the threshold, or super optimized to within 1% of the threshold. The goal is to adjust the magnetic field parameters so that charge damage can be avoided in at least 90% of workpieces processed or optimally in 99.9% of the workpieces.

Through adjustment of the applied magnetic field, the present invention also provides a method for controlling plasma damage to reactor components, such as by reducing the plasma density near the chamber ceiling or the walls. By controlling the magnetic field uniformity within the chamber such as by independently controlling the conductors, the present invention also provides a method to increase or decrease plasma density at different locations within the reactor chamber. It may be desirable, for example, to increase density near the workpiece while decreasing plasma density near the reactor ceiling or inductive window.

By providing sufficient current through the conductors, a properly oriented magnetic field can be created so as to create a force on the charged particles moving horizontal to the workpiece, thereby containing the plasma. Independent control of the conductors provides a means for creating a non-uniform magnetic field within the reactor chamber as illustrated in FIGS. 10 & 11. Independent control of the conductors provides a means for controlling the density of the plasma within the chamber capable of simultaneously and independently adjusting the density of the plasma near the surface of the workpiece and the density of the plasma remote from the surface of the workpiece without adjusting the RF electric field or other plasma parameters.

In addition, a feature of the present invention is that it can be practiced using an applied magnetic filed that is time variant, time invariant, or a combination of the two. A particular process, therefore, can be fine tuned and optimized by controlling the applied magnetic field to adjust the inductive power coupling or deposition within the chamber.

Although the presently preferred embodiment of the current invention is described above, the scope of the invention is not limited thereby and is limited only as claimed below.

What is claimed is:

1. An inductively coupled plasma reactor comprising:
   a) a reactor chamber containing a workpiece and a process gas;
   b) an inductive antenna for exciting the process gas to create an inductively coupled plasma within said chamber comprising ions and electrons; and
   c) a magnetic field generator, independent from said antenna, for creating a time varying magnetic field having a magnitude and duration within the reactor chamber having magnetic lines of force near said workpiece oriented perpendicular to the workpiece and interacting with said inductively coupled plasma near a major surface of said workpiece;
   wherein the magnetic field generator is for applying the time varying magnetic field such that average ion density near the workpiece is adjusted to minimize uneven charge buildup across said workpiece.

2. The inductively coupled plasma reactor of claim 1 wherein the magnetic field is pulsed.

3. The inductively coupled plasma reactor of claim 2 wherein at least one of a magnitude, duration, or duty cycle of the pulses is adjustable.

4. The inductively coupled plasma reactor of claim 3 wherein the plasma comprises particles having positive charge and particles having negative charge and wherein the pulses are adjusted so as to prevent damage to the workpiece caused by uneven build-up of charge on the workpiece.

5. The inductively coupled plasma reactor of claim 3 wherein the plasma comprises ions and electrons and wherein the magnetic field allows average ion density near the workpiece to be increased without otherwise causing damage to the workpiece from uneven charge build-up.

6. The inductively coupled plasma reactor of claim 1 wherein the plasma comprises ions and electrons and wherein application of the magnetic field allows average ion density near the workpiece to be increased without otherwise causing damage to the workpiece from uneven charge build-up.

7. The inductively coupled plasma reactor of claim 1 wherein the plasma comprises ions and electrons and wherein the magnetic field is adjustable such that adjustment of the magnetic field adjusts the average temperature of the electrons with respect to the average ion density near the workpiece.

8. The inductively coupled plasma reactor of claim 1 wherein the magnetic field generator is comprised of a conductor located circumferentially around the chamber.

9. The inductively coupled plasma reactor of claim 8 wherein the magnetic field generator is comprised of a plurality of independently controllable conductors.

10. The inductively coupled plasma reactor of claim 9 wherein the inductive antenna is a coil antenna located above the chamber.

11. The inductively coupled plasma reactor of claim 9 wherein the average strength of at least part of the magnetic field is sufficient to contain the plasma away from at least part of the chamber wall.

12. The inductively coupled plasma reactor of claim 9 wherein at least part of the magnetic field is used to contain the plasma above the workpiece for at least part of the time.

13. The inductively coupled plasma reactor of claim 1 wherein the average strength of the magnetic field is sufficient to contain the plasma away from at least part of the chamber wall.

14. The inductively coupled plasma reactor of claim 1 wherein the magnetic field is used to contain the plasma above the workpiece for at least part of the time.

15. An inductively coupled plasma reactor comprising:

a) a reactor chamber containing a work piece and a process gas;

b) an antenna for applying an RF electric field so as to inductively excite the process gas to create an inductively coupled plasma comprising ions and electrons; and c) a magnetic field generator, independent from said antenna, for creating a pulsed magnetic field within the reactor chamber, the pulses having a magnitudes, duration and duty cycle, the magnetic field having magnetic lines of force near said workpiece oriented perpendicular to the workpiece and interacting with said inductively coupled plasma near a major surface of said workpiece;

wherein the magnetic field generator is for applying the pulsed magnetic field such that average ion density near the workpiece is adjusted to minimize uneven charge buildup across said workpiece.

16. The inductively coupled plasma reactor of claim 15 wherein the plasma comprises ions and electrons having densities and temperatures, and wherein at least one of the magnitude, duration, or duty cycle is adjustable so that adjustment of at least one of the magnitude, duration, or duty cycle adjusts the average electron temperature near the workpiece with respect to the average plasma ion density.

17. The inductively coupled plasma reactor of claim 15 wherein the plasma comprises particles having positive charge and particles having negative charge and wherein at least one of the magnitude, duration, or duty cycle is adjustable such that damage to the workpiece caused by uneven build-up of charge is prevented by adjusting at least one of the magnitude, duration, or duty cycle of the pulses.

18. The inductively coupled plasma reactor of claim 15 wherein the plasma comprises ions and electrons and wherein application of the magnetic field allows average ion density near the workpiece to be increased without causing damage to the workpiece from uneven charge build-up.

19. The inductively coupled plasma reactor of claim 15 wherein the magnetic field generator is comprised of a conductor located circumferentially around the chamber.

20. The inductively coupled plasma reactor of claim 19 wherein the magnetic field generator is comprised of a plurality of independently controllable conductors.

21. The inductively coupled plasma reactor of claim 20 wherein the average strength of at least part of the magnetic field is sufficient to contain the plasma away from at least part of the chamber wall.

22. The inductively coupled plasma reactor of claim 20 wherein at least part of the magnetic field is used to contain the plasma above the workpiece for at least part of the time.

23. The inductively coupled plasma reactor of claim 19 wherein the inductive antenna is a coil antenna located above the chamber.

24. The inductively coupled plasma reactor of claim 15 wherein the average strength of the magnetic field is sufficient to contain the plasma away from at least part of the chamber wall.

25. The inductively coupled plasma reactor of claim 15 wherein the magnetic field is used to contain the plasma above the workpiece at least part of the time.

* * * * *